US 9,245,602 B2

(12) United States Patent
Joshi

(10) Patent No.: US 9,245,602 B2
(45) Date of Patent: Jan. 26, 2016

(54) TECHNIQUES TO BOOST WORD-LINE VOLTAGE USING PARASITIC CAPACITANCES

(71) Applicant: BROADCOM CORPORATION, Irvine, CA (US)

(72) Inventor: Sachin Joshi, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/160,396

(22) Filed: Jan. 21, 2014

(65) Prior Publication Data

US 2015/0162058 A1   Jun. 11, 2015

Related U.S. Application Data

(60) Provisional application No. 61/914,110, filed on Dec. 10, 2013.

(51) Int. Cl.
| | | |
|---|---|---|
| *G11C 8/08* | (2006.01) | |
| *G11C 7/12* | (2006.01) | |
| *G11C 15/04* | (2006.01) | |
| *G11C 11/413* | (2006.01) | |

(52) U.S. Cl.
CPC .. *G11C 7/12* (2013.01); *G11C 8/08* (2013.01); *G11C 11/413* (2013.01); *G11C 15/04* (2013.01)

(58) Field of Classification Search
CPC .......... G11C 7/12; G11C 8/08; G11C 11/413; G11C 15/04
USPC ......... 365/189.11, 185.23, 53, 102, 149, 183, 365/204
See application file for complete search history.

(56) References Cited

U.S. PATENT DOCUMENTS

| | | | | |
|---|---|---|---|---|
| 5,914,908 A | * | 6/1999 | Pinkham ................ | G11C 5/145 327/589 |
| 6,078,513 A | * | 6/2000 | Ong ...................... | G11C 15/043 365/189.07 |
| 6,839,299 B1 | * | 1/2005 | Bhavnagarwala ... | G11C 7/1045 365/185.16 |
| 8,467,263 B2 | * | 6/2013 | Kulkarni ................. | G11C 8/08 365/154 |
| 2003/0012048 A1 | * | 1/2003 | Chappell ............... | G11C 11/412 365/154 |
| 2004/0042254 A1 | * | 3/2004 | Noro ..................... | G11C 11/22 365/145 |
| 2007/0076489 A1 | | 4/2007 | Lin et al. | |
| 2008/0246540 A1 | * | 10/2008 | Okuda ................ | H01L 27/0682 327/565 |
| 2011/0158029 A1 | | 6/2011 | Sasaki | |
| 2012/0206989 A1 | * | 8/2012 | Song ..................... | G11C 5/147 365/226 |
| 2013/0242673 A1 | | 9/2013 | Luthra | |
| 2014/0204657 A1 | * | 7/2014 | Dally ........................... | 365/154 |

\* cited by examiner

*Primary Examiner* — Vu Le
*Assistant Examiner* — Sung Cho
(74) *Attorney, Agent, or Firm* — McDermott Will & Emery LLP

(57) ABSTRACT

A memory device with word-line voltage boosting includes a set of first switches that are operable to couple a word-line of the memory device to a supply voltage to pull the word-line up to a rail voltage. A dummy line including a conductive route can be disposed in a vicinity of the word-line to form a parasitic coupling capacitance with the word-line. A second switch is operable to couple the dummy line to the supply voltage to pull the dummy line to the rail voltage. Pulling up the dummy line boosts the word-line voltage above the rail voltage by a boost voltage.

20 Claims, 4 Drawing Sheets

TECHNIQUES TO BOOST WORD-LINE VOLTAGE USING PARASITIC CAPACITANCES

CROSS-REFERENCE TO RELATED APPLICATIONS

This application claims the benefit of priority under 35 U.S.C. §119 from U.S. Provisional Patent Application 61/914,110 filed Dec. 10, 2013, which is incorporated herein by reference in its entirety.

TECHNICAL FIELD

The present description relates generally to memory devices, and more particularly, but not exclusively, to techniques to boost word-line voltage using parasitic capacitances.

BACKGROUND

Many memory devices such as mass storage memory devices include a large number of memory cells. Each memory cell can be accessed for read and write operations through a word-line and one or more bit-lines. The word-line has to be pulled high to enable read or write operation for a memory cell. The minimum supply voltage for pulling the word-line high can be limited by write failures or read disturb failures. However, as the fabrication process of electronic devices has moved into smaller scale technology nodes, standard power supply voltages of lower magnitudes (e.g., 5V, 3V, 1.8V, and 0.9V) have been adopted by the electronic industry. Boosting of power supply voltage for pulling the word-line can improve memory performance with regard to write failures.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The subject technology provides a method and implementation for boosting a word-line voltage of a memory device, such as a static random-access memory (SRAM), a ternary-content-addressable memory (TCAM), a dynamic random-access memory (DRAM), and/or other memories. In one or more aspects, the subject technology can use the existing parasitic capacitance of the word-line and other parasitic capacitances to boost the word-line voltage. Advantageous features of the subject technology include reduction in chip area, as no additional devices to implement capacitances or other boost circuitry for such voltage boosting are required. The subject technology further reduces the number of pins and power management and delivery routes. The disclosed technique can improve yield by enhancing write margin for a half-differential (HD) SRAMs. The subject technology improves performance by not slowing down memory for write assist, as is done by the existing solutions.

Figure 1A:
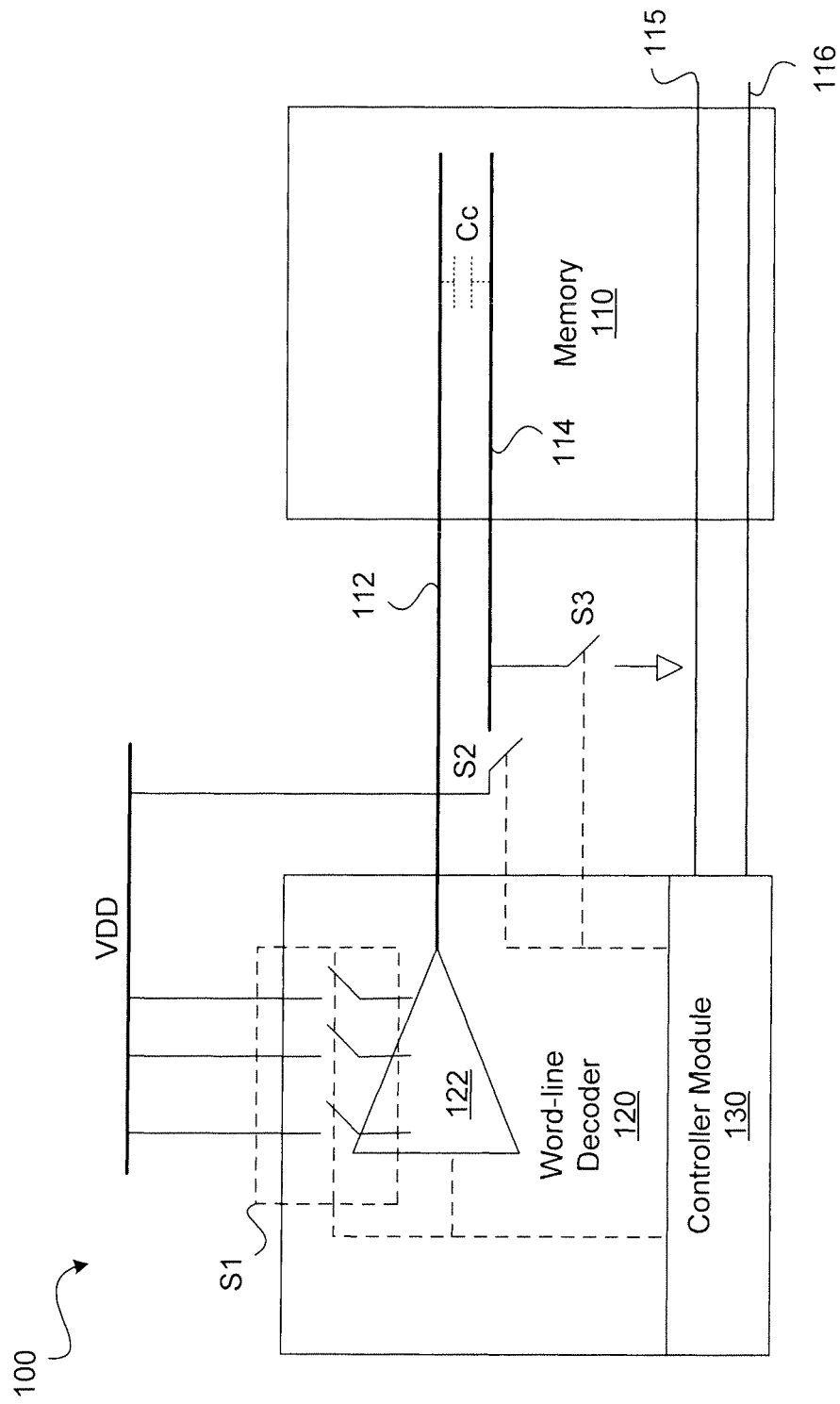
FIGS. 1A-1C illustrate an example of a device for boosting word-line voltage using parasitic capacitances and examples of associated parasitic capacitances in accordance with one or more implementations.
Figure 1C:
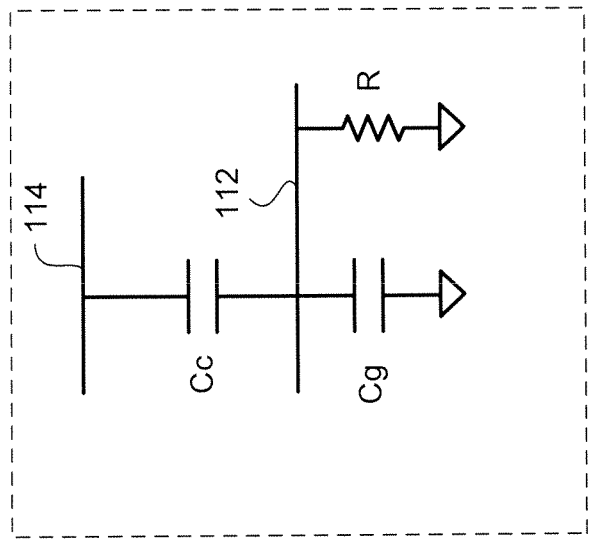
Figure 1B:
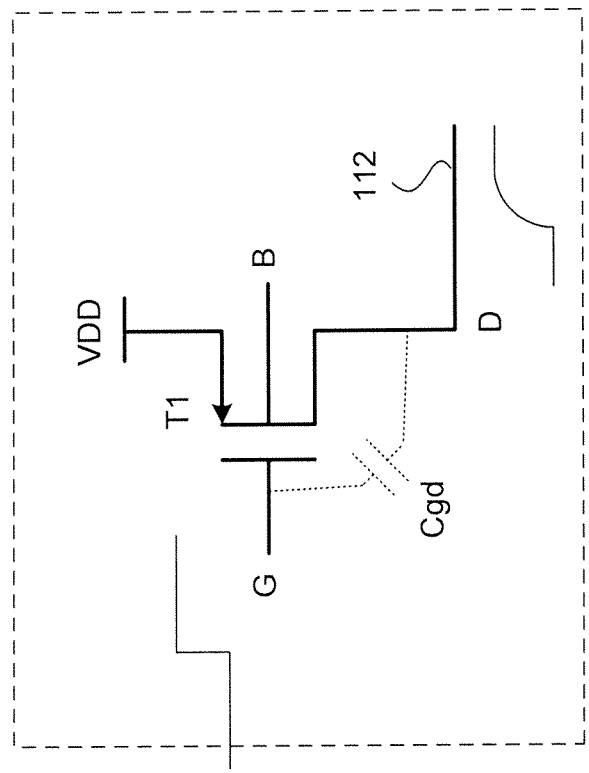

FIGS. 1A-1C illustrate an example of a device 100 for boosting word-line voltage using parasitic capacitances and examples of associated parasitic capacitances in accordance with one or more implementations of the subject technology. The device 100 includes a memory device 110, a word-line decoder 120 including a word-line driver (e.g., buffer) 122 and a first set of switches S1, a word-line 112, a dummy line 114, a second switch S2, a third switch (e.g., the dummy-line switch) S3, and a controller module 130. Examples of the memory device 110 include an SRAM, a ternary-content-addressable memory (TCAM), a DRAM, and other memories. The first set of switches S1 are coupled in parallel between a supply voltage that provides a rail voltage of VDD and to the word-line 112. Each of the switches of the first set of switches S1 is operable to couple the word-line 112 to the supply voltage. The second and third switches S2 and S3 are operable to couple the dummy line 114 to the supply voltage and ground potential, respectively. In some aspects, the switches of the first set of switches S1 can be implemented as part of the driver 122. The first set of switches S1 and switches S2 and S3 can be controlled by a controller module 130, which can be implemented in hardware and/or software.

The word line decoder 120 can decode an address and enable the word-line driver 122 associated with the word-line 112, when the decoded address corresponds to word-line 112. The enabled word-line driver 122 can pull the word-line 112 up to the rail voltage VDD to facilitate read and/or write operations of the memory cells coupled to the word-line 112. It is understood that some memory cells coupled to the word-line 112, when the word-line 112 is pulled high only to the rail voltage VDD, can become un-writable and/or un-readable. This can happen especially at low values of VDD (e.g., of smaller scale technology nodes such as 28 nano-meter scale) and can decrease the yield of the memory device as the unstable memory cells become in-operable (e.g., un-writable). This problem can be alleviated by employing a write assist through boosting the word-line voltage during read and write operations. The existing solutions use a separate power source with adaptive control logic or use additional circuit elements (e.g., capacitors) to provide for word-line voltage boosting. The subject technology, as described here, can reduce chip area by boosting the word-line voltage above the supply voltage VDD without the use of a separate power source with adaptive control logic or additional circuit elements. The controller module 130 can control the behavior of the switches (e.g., S1, S2, and S3) by using the signals on a track word-line 115 and a track dummy line 116. The track word-line 115 and the track dummy line 116 already exist in the memory device (e.g., SRAM) and can be leveraged to track the status of the word-line 112 and the dummy line 114.

In one or more implementations of the subject technology, the device 100 can boost the voltage of the word-line 112 of the memory device 110 by first coupling the word-line 112 to the supply voltage to pull the word-line up to the rail voltage VDD and coupling the dummy line 114 to the supply voltage to pull the dummy line to the rail voltage VDD. Pulling up the dummy line 114 boosts the word-line voltage above the rail voltage VDD by a boost voltage, as described in more details herein. In some aspects, the dummy line 114 includes a conductive route disposed in a vicinity of the word-line 112 that forms a parasitic coupling capacitance (e.g., Cc) with the word-line 112. For example, in SRAMs, the dummy line 114 can be a shield line that runs in parallel to the word-line. In TCAM memory devices, a match line of the TCAM can form the dummy line 114.

In some aspects, boosting the voltage of the word-line 112 of the memory device 110 can be performed during a memory read and/or write operation to assist the write operation. In practice, the word-line 112 is pulled up to the rail voltage VDD, before the read and/or write operation is initiated. In a next step, the dummy line 114 is pulled up to boost the word-line voltage. The boosting of the word-line voltage is achieved by charging the coupling capacitor (e.g., of the parasitic capacitor with a capacitance Cc) between the word-line 112 and the dummy line 114). In one or more aspects, prior to the memory write operation, the dummy line 114 can be pre-discharged to ground potential using the third switch S3.

In one or more implementations, the word-line 112 is decoupled from the supply voltage, partially or completely, by the first set of switches S1, prior to coupling of the dummy line 114 to the supply voltage. In some aspects, the first set of switches S1 can include multiple switches, every one of which is independently controlled by the controller module 130. In other words, the controller module 130 is able to cause closing or opening of any number of the switches of the first set of switches S1.

In some implementations, the switches of the first set of switches S1 and switches S2 and S3 can be implemented using PMOS transistors (e.g., Fin field-effect transistor (FinFET), as shown in FIG. 1B. The source terminal of the example PMOS transistor T1 is connected to the supply voltage and is at the rail voltage of VDD. When the voltage at a gate terminal G of the PMOS transistor T1 makes a low-to-high transition to open the switch (e.g., any of switches of the set of first switches S1), the parasitic capacitance Cgd between the gate and the drain terminals of transistor T1 charges up, which cause the voltage at the word-line 112 coupled to the drain terminal D of the transistor T1 to make a low-to-high transition. In some aspects, this low-to-high transition of the gate-drain parasitic capacitances of the PMOS transistors of the first set of switches S1 can be leveraged to boost the word-line 112 to a voltage higher than the supply voltage (e.g., VDD).

Shown in FIG. 1C is an AC equivalent circuit depicting the parasitic capacitances Cc between the dummy line 114 and the word-line 112 and Cg between the word-line 112 and ground potential. The resistance R represents equivalent resistance of the closed switches (e.g., PMOS transistors) of the first set of switches S1. The value of the resistance R depends on a count of the number of switches of the first set of switches S1 that are operated by the controller module 130 to couple the word-line 112 to the supply voltage. As seen from the AC equivalent circuit of FIG. 1C, the amount of voltage change (e.g., the boost voltage) of the word-line 112 from the supply voltage depends on the value of R. Consequently, changing the count of the number of switches of the first set of switches S1, operated to couple the word-line 112 to the supply voltage, can be employed as a first technique to change the boost voltage of the word-line 112.

In one or more aspects, the boost voltage can be controlled by a second technique that is changing a time duration that the second switch S2 is closed, which can change the charging level of the capacitance Cc. In some aspects, the first and the second techniques can be used simultaneously to change the boost voltage of the word-line 112. In some aspects, the change in the boost voltage can be made programmable by using one or both of the first and second techniques described above, and implemented via the controller module 130.

Figure 2:
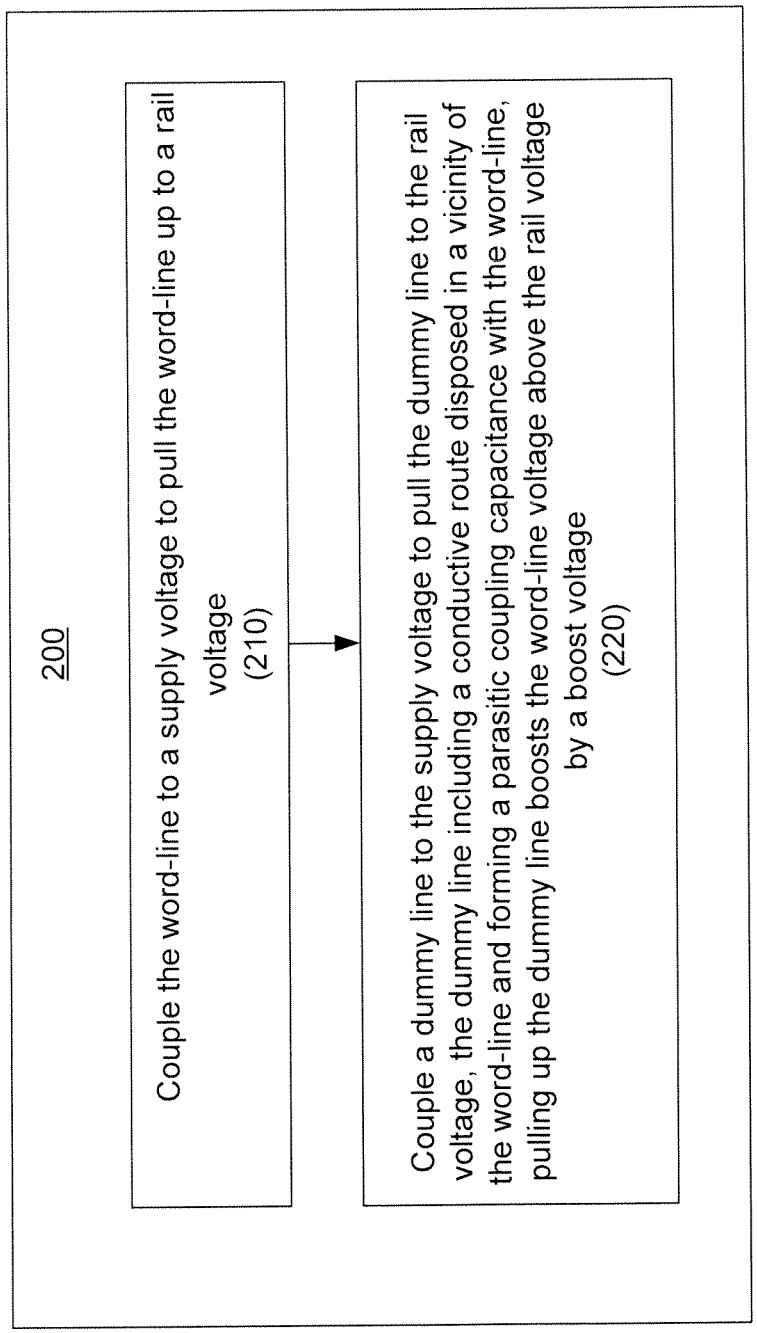
FIG. 2 illustrates an example of a method for boosting word-line voltage using parasitic capacitances in accordance with one or more implementations.

FIG. 2 illustrates an example of a method 200 for boosting word-line voltage using parasitic capacitances in accordance with one or more implementations of the subject technology. For explanatory purposes, the example method 200 is described herein with reference to, but is not limited to, the device 100 of FIG. 1A. Further for explanatory purposes, the blocks of the example method 200 are described herein as occurring in serial, or linearly. However, multiple blocks of the example method 200 can occur in parallel. In addition, the blocks of the example method 200 need not be performed in the order shown and/or one or more of the blocks of the example method 200 need not be performed.

A word-line (e.g., 112 of FIG. 1A) is coupled to a supply voltage (e.g., with voltage VDD of FIG. 1A) to pull the word-line up to a rail voltage (e.g., VDD of FIG. 1A) (210). A dummy line (e.g., 114 of FIG. 1A) is coupled the supply voltage to pull the dummy line to the rail voltage (220). The dummy line includes a conductive route disposed in a vicinity of the word-line and can form a parasitic coupling capacitance (e.g., Cc of FIG. 1A) with the word-line. Pulling up the dummy line can boost the word-line voltage above the rail voltage by a boost voltage.

Figure 3:
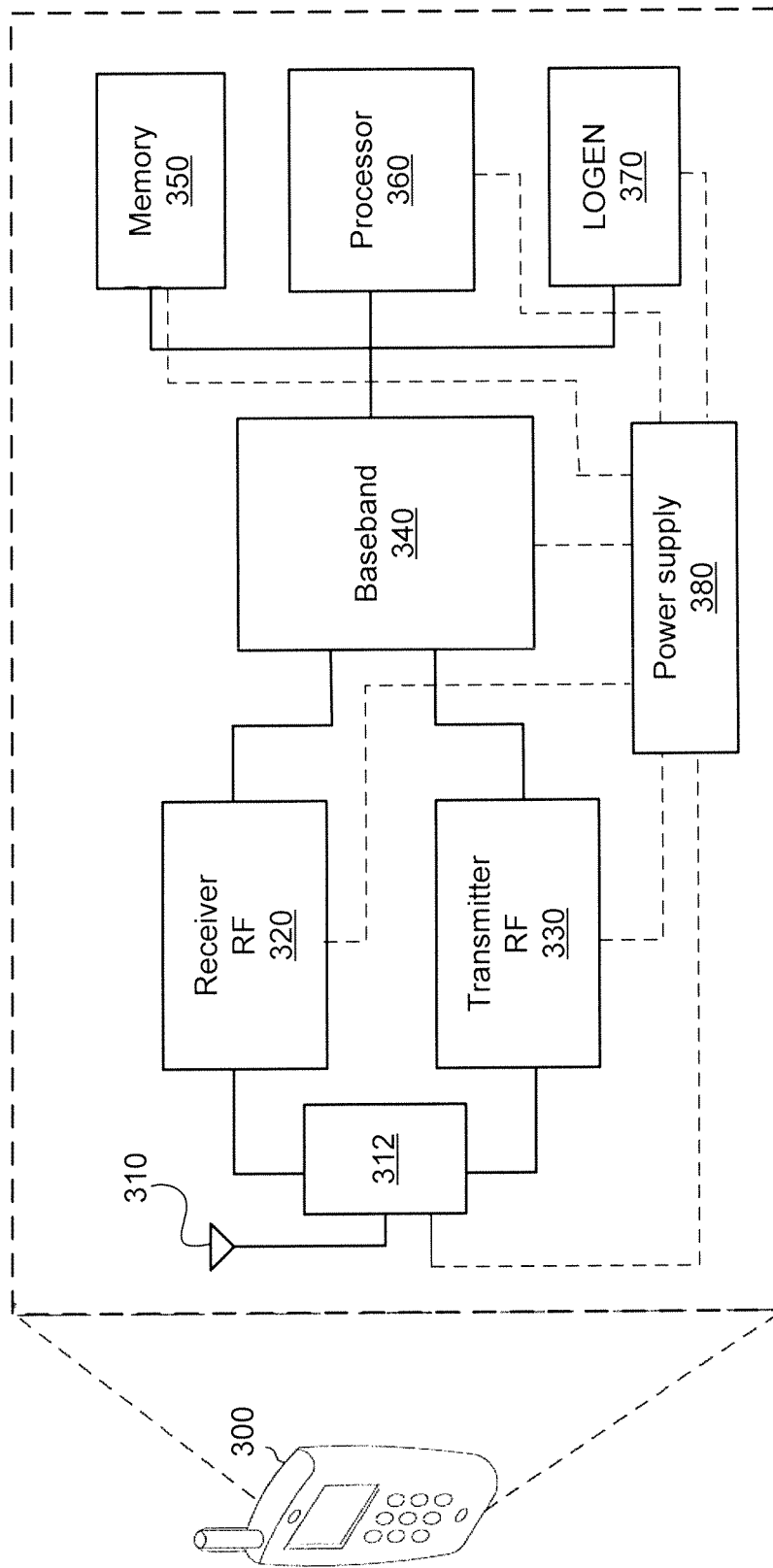
FIG. 3 illustrates an example of a wireless communication device in accordance with one or more implementations.

FIG. 3 illustrates an example of a wireless communication device in accordance with one or more implementations of the subject technology. The wireless communication device 300 can comprise a radio-frequency (RF) antenna 310, a receiver 320, a transmitter 330, a baseband processing module 340, a memory 350, a processor 360, a local oscillator generator (LOGEN) 370, and a power supply 380. In various embodiments of the subject technology, one or more of the blocks represented in FIG. 3 can be integrated on one or more semiconductor substrates. For example, the blocks 320-370 can be realized in a single chip or a single system on chip, or can be realized in a multi-chip chipset.

The RF antenna 310 can be suitable for transmitting and/or receiving RF signals (e.g., wireless signals) over a wide range of frequencies. Although a single RF antenna 310 is illustrated, the subject technology is not so limited.

The receiver 320 comprises suitable logic circuitry and/or code that can be operable to receive and process signals from the RF antenna 310. The receiver 320 may, for example, be operable to amplify and/or down-covert received wireless signals. In various embodiments of the subject technology, the receiver 320 is operable to cancel noise in received signals and can be linear over a wide range of frequencies. In this manner, the receiver 320 is suitable for receiving signals in accordance with a variety of wireless standards. Wi-Fi, WiMAX, Bluetooth, and various cellular standards.

The transmitter 330 comprises suitable logic circuitry and/ or code that can be operable to process and transmit signals from the RF antenna 310. The transmitter 330 may, for example, be operable to up-covert baseband signals to RF signals and amplify RF signals. In various embodiments of the subject technology, the transmitter 330 is operable to up-convert and amplify baseband signals processed in accordance with a variety of wireless standards. Examples of such standards include Wi-Fi, WiMAX, Bluetooth, and various cellular standards. In various embodiments of the subject technology, the transmitter 330 is operable to provide signals for further amplification by one or more power amplifiers.

The duplexer 312 provides isolation in the transmit band to avoid saturation of the receiver 320 or damaging parts of the receiver 320, and to relax one or more design requirements of the receiver 320. Furthermore, the duplexer 312 can attenuate the noise in the receive band. The duplexer is operable in multiple frequency bands of various wireless standards.

The baseband processing module 340 comprises suitable logic, circuitry, interfaces, and/or code that can be operable to perform processing of baseband signals. The baseband processing module 340 may, for example, analyze received signals and generate control and/or feedback signals for configuring various components of the wireless communication device 300 such as the receiver 320. The baseband processing module 340 is operable to encode, decode, transcode, modulate, demodulate, encrypt, decrypt, scramble, descramble, and/or otherwise process data in accordance with one or more wireless standards.

The processor 360 comprises suitable logic, circuitry, and/or code that can enable processing data and/or controlling operations of the wireless communication device 300. In this regard, the processor 360 is enabled to provide control signals to various other portions of the wireless communication device 300. The processor 360 can also control transfers of data between various portions of the wireless communication device 300. Additionally, the processor 360 can enable implementation of an operating system or otherwise execute code to manage operations of the wireless communication device 300.

The memory 350 comprises suitable logic, circuitry, and/or code that can enable storage of various types of information such as received data, generated data, code, and/or configuration information. The memory 350 comprises, for example, RAM (e.g. SRAM), ROM, flash, and/or magnetic storage. In various embodiment of the subject technology, Information stored in the memory 350 can be utilized for configuring the receiver 320 and/or the baseband processing module 340. The SRAM includes a dummy line (e.g., 114 of FIG. 1A) and the first set of switches S1 and the switches S2 and S3 (e.g., of FIG. 1A) that can be used as described above to boost the voltage of the word-line (e.g., 112 of FIG. 1A) of the SRAM above the supply voltage provided by the power supply 380 to prevent the memory cells of the SRAM to become un-readable or un-writable. The operation of the first set of switches S1 and the switches S2 and S3 can be controlled by a controller such as the processor 360.

The local oscillator generator (LOG EN) 370 comprises suitable logic, circuitry, interfaces, and/or code that can be operable to generate one or more oscillating signals of one or more frequencies. The LOGEN 370 can be operable to generate digital and/or analog signals. In this manner, the LOGEN 370 can be operable to generate one or more clock signals and/or sinusoidal signals. Characteristics of the oscillating signals such as the frequency and duty cycle can be determined based on one or more control signals from, for example, the processor 360 and/or the baseband processing module 340.

In operation, the processor 360 can configure the various components of the wireless communication device 300 based on a wireless standard according to which it is desired to receive signals. Wireless signals can be received via the RF antenna 310 and amplified and down-converted by the receiver 320. The baseband processing module 340 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 350, and/or information affecting and/or enabling operation of the wireless communication device 300. The baseband processing module 340 can modulate, encode and perform other processing on audio, video, and/or control signals to be transmitted by the transmitter 330 in accordance to various wireless standards. The power supply 380 can provide one or more regulated rail voltages (e.g., $V_{DD}$) for various circuitries of the wireless communication device 300.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A method for boosting word-line voltage of a word-line of a memory device, the method comprising:
   coupling the word-line to a supply voltage to pull the word-line up to a rail voltage; and
   coupling a dummy line to the supply voltage via closing a dummy line switch to pull the dummy line to the rail voltage, the dummy line comprising a conductive route disposed in a vicinity of the word-line and forming a parasitic coupling capacitance with the word-line, wherein pulling up the dummy line boosts the word-line voltage above the rail voltage by a boost voltage; and
   controlling the boost voltage by changing a time duration that the dummy-line switch is closed.

2. The method of claim 1, wherein boosting the word-line voltage of the memory device is performed during a memory read or write operation to assist the read or write operation.

3. The method of claim 1, further comprising pre-discharging the dummy line to ground potential prior to a memory read or write operation.

4. The method of claim 1, further comprising decoupling the word-line from the supply voltage prior to coupling of the dummy line to the supply voltage.

5. The method of claim 4, further comprising using a plurality of switches to perform coupling and decoupling of the word-line to and from the supply voltage.

6. The method of claim 5, further comprising implementing the plurality of switches by using PMOS transistors, and leveraging a low-to-high voltage transition of gate-drain parasitic capacitances of the PMOS transistors to further boost the word-line voltage.

7. The method of claim 5, wherein the method further comprises controlling the boost voltage by changing a count of closed switches of the plurality of switches used to couple the word-line to the supply voltage, wherein changing the count of the closed switches of the plurality of switches changes a resistance between the supply voltage and the word-line.

8. The method of claim 1, wherein the memory device comprises a ternary content-addressable memory (TCAM), wherein the dummy line comprises a match line of the TCAM.

9. The method of claim 1, wherein the memory device comprises a static random-access memory (SRAM), and wherein the dummy line comprises a shield line running in parallel to the word-line of the SRAM.

10. A memory device with word-line voltage boosting, the memory device comprising:
    a set of first switches operable to couple a word-line of the memory device to a supply voltage to pull the word-line up to a rail voltage;
    a dummy line comprising a conductive route disposed in a vicinity of the word-line and forming a parasitic coupling capacitance with the word-line; and
    a second switch operable to couple the dummy line to the supply voltage to pull the dummy line to the rail voltage, wherein pulling up the dummy line boosts the word-line voltage above the rail voltage by a boost voltage, wherein the boost voltage is controlled by changing a time duration that the second switch is kept closed.

11. The memory device of claim 10, further comprising a controller module configured to operate the second switch to couple the dummy line to the supply voltage prior to initiating a read or write operation of the memory device.

12. The memory device of claim 10, further comprising a third switch operable to pre-discharge the dummy line to ground potential, and a controller module configured to operate the third switch to pre-discharge the dummy line to ground potential prior to initiating a memory read or write operation.

13. The memory device of claim 10, further comprising a controller module configured to operate the second switch to couple the dummy line to the supply voltage, and wherein the controller module is configured to operate the set of first switches to decouple the word-line from the supply voltage prior to operating the second switch to couple the dummy line to the supply voltage.

14. The memory device of claim 10, wherein the set of first switches are implemented by using PMOS transistors, and wherein a low-to-high voltage transition of gate-drain parasitic capacitances of the PMOS transistors are leveraged to further boost the word-line voltage.

15. The memory device of claim 14, further comprising a controller module configured to operate the set of the first switches to close one or more of the set of the first switches to couple the word-line to the supply voltage.

16. The memory device of claim 15, wherein the controller module is configured to change the boost voltage by changing a count of closed switches of the set of first switches used to couple the word-line to the supply voltage, wherein changing the count of the closed switches of the set of first switches changes a resistance between the supply voltage and the word-line.

17. The memory device of claim 10, further comprising a controller module configured to operate the second switch to close in order to couple the dummy line to the supply voltage, and wherein the controller module is configured to control the boost voltage by changing the time duration that the second switch is kept closed.

18. The memory device of claim 10, wherein the dummy line comprises a match line if the memory device comprises a ternary content-addressable memory (TCAM) or a shield line running in parallel to the word-line if the memory device comprises a static random-access memory (SRAM).

19. A communication device, comprising:
a memory device comprising:
- a set of first switches operable to couple a word-line of the memory device to a supply voltage to pull the word-line up to a rail voltage;
- a dummy line comprising a conductive route disposed in a vicinity of the word-line and forming a parasitic coupling capacitance with the word-line; and
- a second switch operable to couple the dummy line to the supply voltage to pull the dummy line to the rail voltage, the, wherein pulling up the dummy line boosts the word-line voltage above the rail voltage by a boost voltage, wherein the boost voltage is controlled by changing a time duration that the second switch is kept closed.

20. The communication device of claim 19, wherein the memory device comprises a ternary content-addressable memory (TCAM) or a static random-access memory (SRAM), wherein the memory device further comprises a controller module configured to operate the set of first switches and the second switch, wherein the set of first switches are implemented by using PMOS transistors, and wherein a low-to-high voltage transition of gate-drain parasitic capacitances of the PMOS transistors are leveraged to further boost the word-line voltage.

* * * * *